United States Patent
Bachman et al.

(10) Patent No.: US 8,987,137 B2
(45) Date of Patent: Mar. 24, 2015

(54) METHOD OF FABRICATION OF THROUGH-SUBSTRATE VIAS

(75) Inventors: Mark A. Bachman, Sinking Springs, PA (US); Sailesh M. Merchant, Macungie, PA (US); John Osenbach, Kutztown, PA (US)

(73) Assignee: LSI Corporation, San Jose, CA (US)

( * ) Notice: Subject to any disclaimer, the term of this patent is extended or adjusted under 35 U.S.C. 154(b) by 1024 days.

(21) Appl. No.: 12/969,836

(22) Filed: Dec. 16, 2010

(65) Prior Publication Data

US 2012/0153492 A1    Jun. 21, 2012

(51) Int. Cl.
*H01L 21/44* (2006.01)
*H01L 21/768* (2006.01)
*H01L 25/065* (2006.01)

(52) U.S. Cl.
CPC ...... *H01L 21/76898* (2013.01); *H01L 25/0657* (2013.01); *H01L 2225/06513* (2013.01); *H01L 2225/06541* (2013.01); *H01L 2224/80894* (2013.01); *H01L 2224/08145* (2013.01); *H01L 2224/80895* (2013.01); *H01L 2224/80896* (2013.01)
USPC .......................................................... 438/677

(58) Field of Classification Search
CPC .................. H01L 21/76898; H01L 23/481
USPC ........................................................ 438/667
See application file for complete search history.

(56) References Cited

U.S. PATENT DOCUMENTS

| | | | |
|---|---|---|---|
| 7,276,787 B2 | 10/2007 | Edelstein et al. | |
| 7,645,678 B2 | 1/2010 | Wu | |
| 7,859,114 B2 | 12/2010 | Lindgren et al. | |
| 8,742,535 B2 | 6/2014 | Bachman et al. | |
| 2008/0079112 A1 | 4/2008 | Uchiyama | |
| 2008/0124845 A1 | 5/2008 | Yu et al. | |
| 2008/0318361 A1 | 12/2008 | Han et al. | |
| 2009/0001598 A1 | 1/2009 | Chiou et al. | |
| 2009/0001602 A1 | 1/2009 | Chung | |
| 2009/0039471 A1 | 2/2009 | Katagiri | |
| 2010/0090219 A1 | 4/2010 | Jung | |
| 2010/0102453 A1 | 4/2010 | Tseng et al. | |
| 2010/0224965 A1 | 9/2010 | Kuo | |
| 2011/0033980 A1* | 2/2011 | Chung | 438/109 |
| 2012/0091593 A1 | 4/2012 | Cheng et al. | |
| 2012/0153492 A1 | 6/2012 | Bachman et al. | |
| 2013/0119543 A1* | 5/2013 | Yu et al. | 257/741 |
| 2013/0299950 A1* | 11/2013 | Hummler | 257/622 |

OTHER PUBLICATIONS

U.S. Appl. No. 12/969,852 entitled "Integration of Shallow-Trench Isolation and Through-Substrate Vias Into Integrated Circuit Designs" filed Dec. 16, 2010 to Mark A. Bachman.

* cited by examiner

*Primary Examiner* — Yu-Hsi D Sun

(57) ABSTRACT

A method of manufacturing a through-substrate-via structure. The method comprises providing a substrate having a front-side and an opposite back-side. A through-substrate via opening is formed in the front-side of the substrate. The through-substrate-via opening does not penetrate an outer surface of the back-side of the substrate. The through-substrate-via opening is filled with a solid fill material. Portions of the substrate from the outer surface of the back-side of the substrate are removed to thereby expose the fill material. At least portions of the exposed fill material are removed to form a back-side through-substrate via opening that traverses an entire thickness of the substrate. The back-side through-substrate via opening is filled with an electrically conductive material.

18 Claims, 7 Drawing Sheets

METHOD OF FABRICATION OF THROUGH-SUBSTRATE VIAS

CROSS-REFERENCE TO RELATED APPLICATIONS

The present application is related to U.S. patent application Ser. No. 12/969,852 to M. A. Bachman, S. M. Merchant and J. Osenbach, entitled, INTEGRATION OF SHALLOW TRENCH ISOLATION AND THROUGH-SUBSTRATE VIAS INTO INTEGRATED CIRCUIT DESIGNS ("Bachman et al."), and which is commonly assigned with the present application, which is incorporated herein by reference in its entirety.

TECHNICAL FIELD

This application is directed, in general, to integrated circuit fabrication and, more specifically, to through-substrate via fabrication.

BACKGROUND

Through-Substrate Via (TSV) technology is being developed in the large scale integrated circuit package industry to facilitate the fabrication and design of a three-dimensional interconnect system. Using TSVs, connections can be made from an integrated circuit (IC) on the front-side (the side on which the IC components are fabricated) of a substrate die through the same die to the dies' back-side, where a connection can be made to another substrate die, interconnect structure, interposer, or IC package substrate. The efficient fabrication of such TSVs, which may number in the hundreds or thousands per die, is an important aspect of IC package cost, performance and reliability.

SUMMARY

The present disclosure provides, in one embodiment, a method of manufacturing a through-substrate-via structure. The method comprises providing a substrate having a front-side and an opposite back-side. A through-substrate via opening is formed in the front-side of the substrate. The through-substrate-via opening does not penetrate an outer surface of the back-side of the substrate. The through-substrate-via opening is filled with a solid fill material. Portions of the substrate from the outer surface of the back-side of the substrate are removed to thereby expose the fill material. At least portions of the exposed fill material are removed to form a back-side through-substrate via opening that traverses an entire thickness of the substrate. The back-side through-substrate via opening is filled with an electrically conductive material.

Another embodiment is a method of manufacturing an integrated circuit that comprises providing a substrate having a front-side and an opposite back-side and forming a through-substrate-via structure by the above-described steps.

Still another embodiment is a through-substrate-via structure manufactured by a method that includes the above-described steps.

Yet another embodiment is an integrated circuit, comprising a substrate and a through-substrate-via structure via that traverses the substrate, wherein the through-substrate-via structure is formed by the above-described steps.

BRIEF DESCRIPTION

Figure 1:
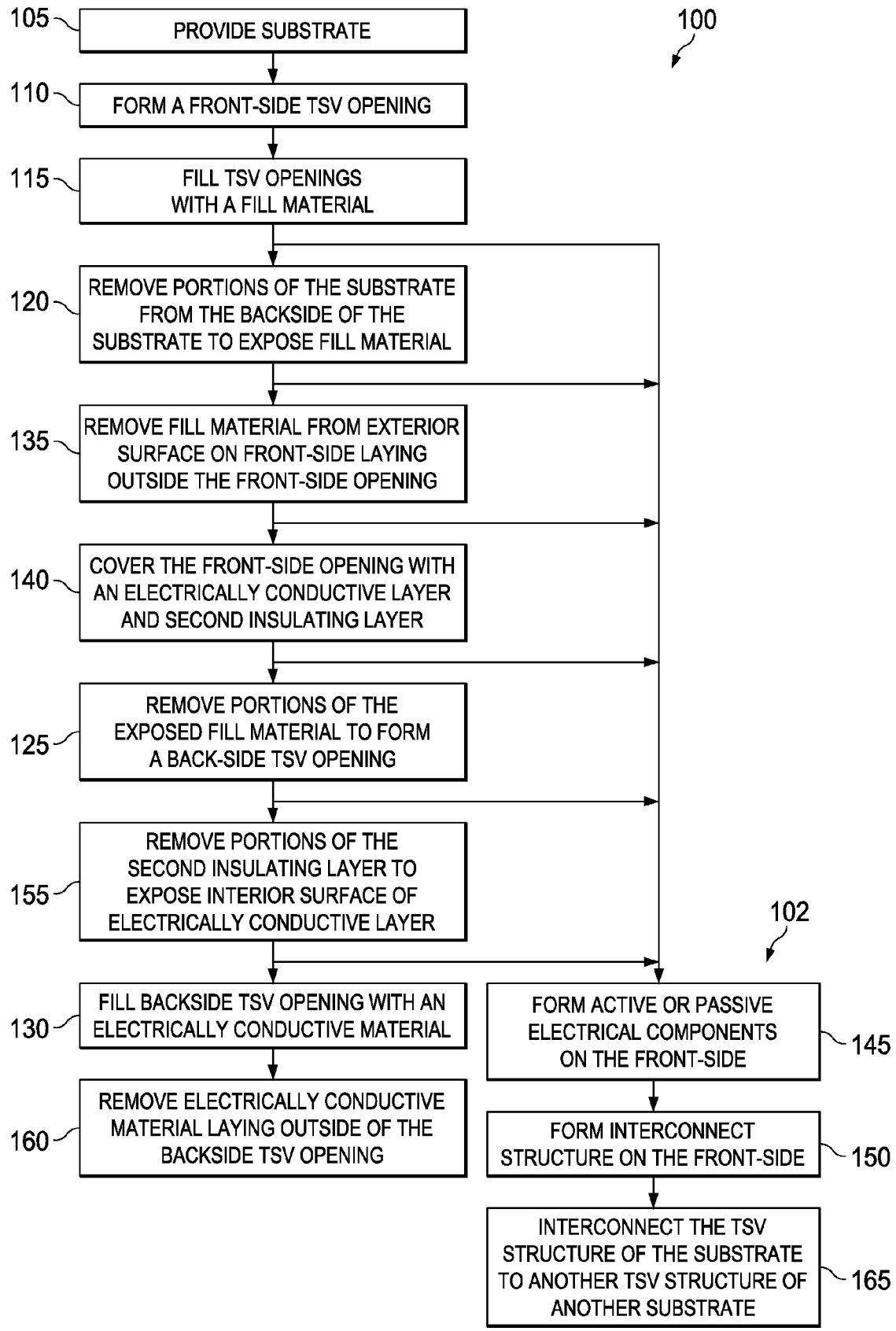

For a more complete understanding of the present invention, reference is now made to the following descriptions taken in conjunction with the accompanying drawings, in which:

FIG. 1 presents a flow diagram illustrating selective steps in an example embodiment of a method of manufacturing an through-substrate-via structure of the disclosure and example embodiment of a method of manufacturing an integrated circuit of the disclosure; and FIGS. 2-12 present cross-sectional views of selected steps in an example method of manufacturing an example through-substrate-via structure and an example integrated circuit of the disclosure in accordance with the method presented in FIG. 1.

DETAILED DESCRIPTION

For the purposes of the present disclosure, the term, "or," as used herein, refers to a non-exclusive or, unless otherwise indicated.

The present disclosure benefits from the observation that during the manufacture of an IC, using a process that includes forming a metal-filled TSV before other IC components are fabricated, can result in lower-than-desired IC device yields or reliability. A problem which can be encountered is cracking caused by the mismatch of the expansion of the metal in the TSV and the surrounding substrate, occurring during subsequent heat treatments in the fabrication and interconnection of the IC components. For instance, cracking in the substrate may lead to failure of the IC when exposed to the high temperature processing required for metal layer and dielectric layer fabrication to interconnect the IC components.

In other cases, TSV fabrication performed after IC component fabrication can also result in lower-than-desired device yields. For instance, TSV fabrication can include filling TSV opening in the back-side of the substrate with a metal after the device components have been fabricated on the front-side of the substrate. However, this process requires that the back-side TSV opening be well-aligned with the metal interconnects formed on the front-side of the substrate.

Embodiments of the present disclosure address these deficiencies by providing an improved method of manufacturing TSV and IC. The method uses front-side processing which includes forming a front-side TSV opening which is front-side filled with a fill material. The front-side processing is followed by back-side processing which includes removing portions of the fill material and back-side filling of the TSV with an electrically conductive material. This process can help ensure that the TSV is aligned with the metal interconnects formed on the front-side of the substrate while at the same time avoid cracking of the substrate during the front-side fabrication of IC components that can include high temperature processes (e.g., temperature of about 200° C. or higher).

One embodiment of the disclosure is a method of manufacturing a through-substrate via. FIG. 1 presents a flow diagram illustrating selective steps in an example embodiment of a method 100 of manufacture of an example through-substrate via.

The method 100 comprises a step 105 of providing a substrate having a front-side and an opposite back-side. The method 100 also comprises a step 110 of forming through-substrate via opening in the front-side of the substrate. The method 100 further includes a step 115 of filling the through-substrate via opening with a solid fill material. The method 100 additionally comprises a step 120 of removing portions of the substrate from the outer surface of the back-side of the substrate to thereby expose the fill material. The method 100 also comprises a step 125 of removing at least portions of the exposed fill material to form a back-side through-substrate via opening that traverses an entire thickness of the substrate. The method further comprises a step 130 of filling the back-side through-substrate via opening with an electrically conductive material.

FIG. 1 also illustrates another embodiment of the disclosure, a method 102 of manufacturing an integrated circuit. The method 102 comprises the step 105 of providing a substrate and method 100 of forming through-substrate via structure including steps 110-130.

Figure 2:
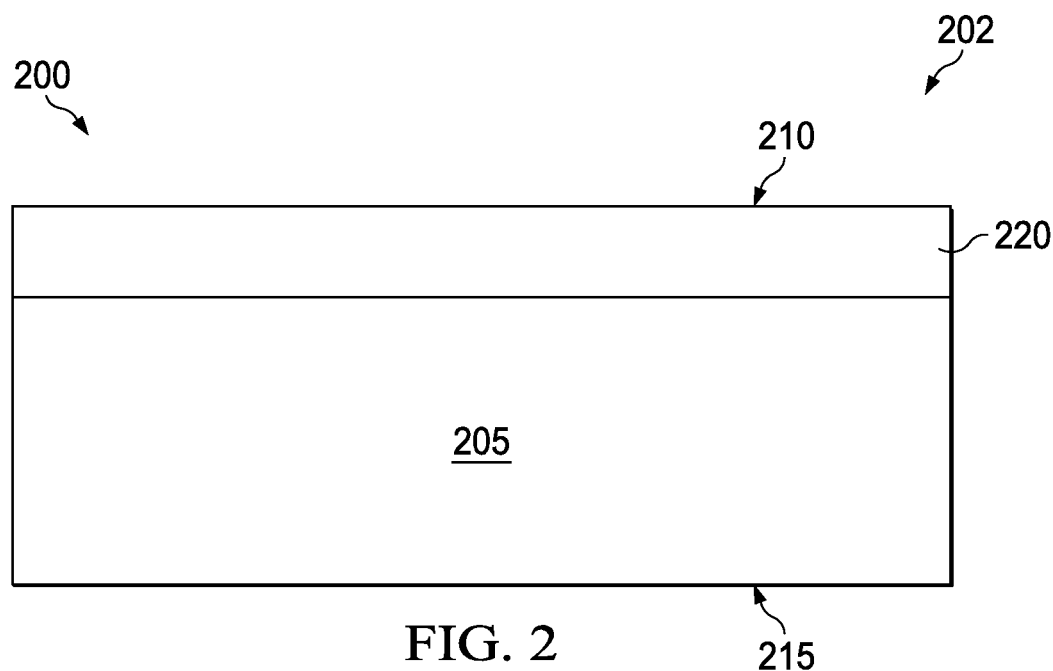

To further illustrate aspects of the disclosed methods, 100, 102, FIGS. 2-12 present cross-sectional views of selected steps in an example method of manufacturing an example TSV structure 200 of the disclosure, in accordance with the example method presented in FIG. 1. The TSV structure 200 is included in an example IC 202 of the disclosure. With continuing reference to FIG. 1 throughout, FIG. 2 shows the TSV structure 200 and IC 202 after the step 105 of providing a substrate 205 having a front-side 210 and an opposite back-side 215. Example embodiments of the substrate 205 include a wafer substrate composed of silicon or other semiconductor materials, substrate dies, package substrates, or interposer substrates. Some embodiments of the substrate 205 can have multiple layers to facilitate the efficient fabrication of various IC components. For instance, some embodiments of the substrate 205 include a constituent layer 220. For example, some embodiments of the constituent layer 220 can include a mono-crystalline layer composed of silicon such as epitaxial-formed crystalline silicon. In other embodiments, the constituent layer 220 can include a silicon-on-insulator layer, or polysilicon layer or other material layers well known to those skilled in the art. In some cases, the constituent layer 220 can have a thickness 222 in a range from 10 to 20 microns. One of ordinary skill would appreciate that other types of substrates and constituent layers could be used, if desired.

Figure 3:
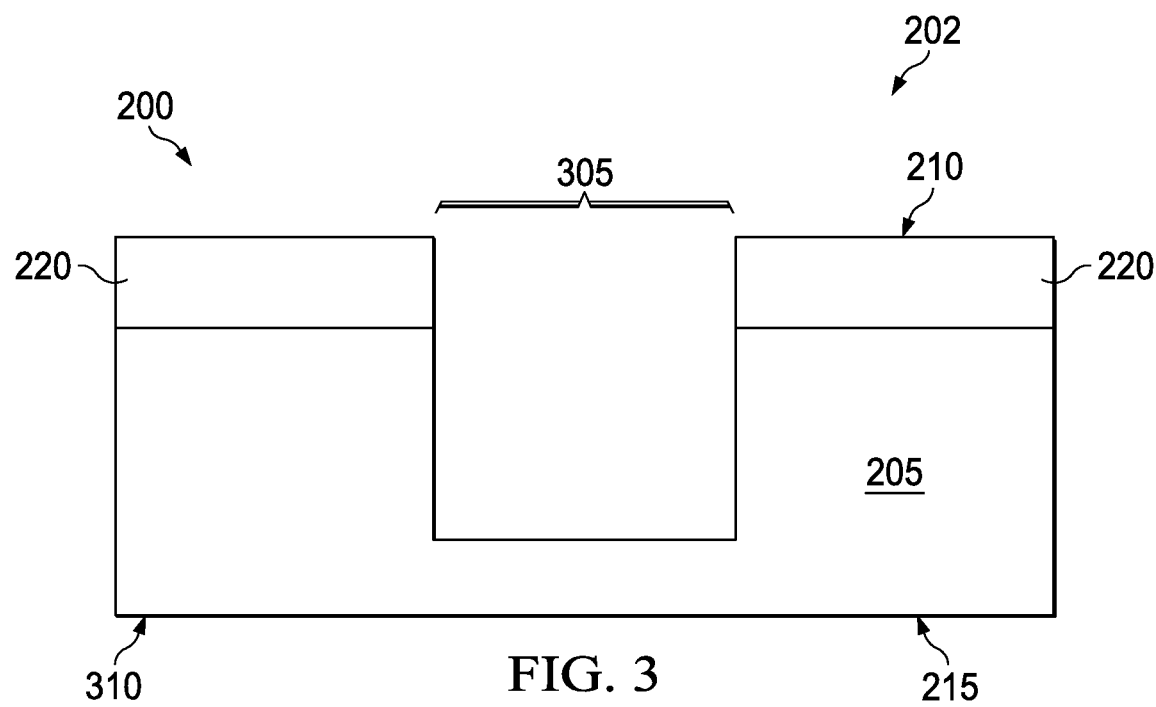

FIG. 3 shows the TSV structure 200 and IC 202 after the step 110 of forming a through-substrate via opening 305 in the front-side 210 of the substrate 205. One of ordinary skill in the art would be familiar with the procedures to pattern (e.g., by conventional photolithography and masking processes) and to etch (e.g., reactive ion etching or other conventional etching processes) the front-side 210 of the substrate 205 to form the opening 305 in accordance with step 110. As illustrated in FIG. 3, the through-substrate-via opening 305 is formed so as to not penetrate an outer surface 310 of the back-side 215 of the substrate 205.

Figure 4:
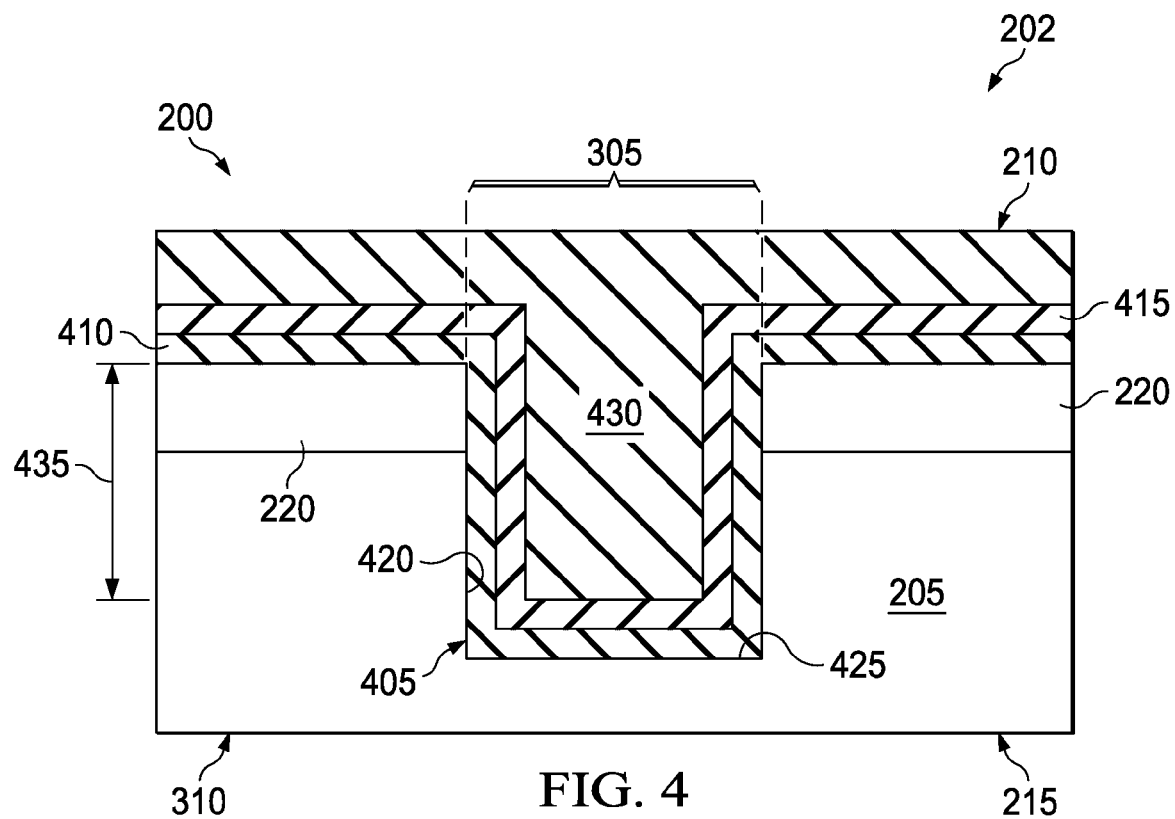

FIG. 4 shows the TSV structure 200 and IC 202 after the step 115 of filling the TSV opening 305 with a solid fill material 405. One of ordinary skill in the art would be familiar with conventional filling methods such as chemical vapor deposition (CVD), physical vapor deposition (PVD) or both, or other methods, to accomplish the filling step 115.

Filling the opening 305 with a material 405 whose coefficient of thermal expansion is close to that of the substrate 205 helps to avoid producing stresses or strains on the substrate when the substrate 205 is heated, e.g., as part of various process steps in the fabrication of an IC or IC package. In some embodiments, for instance, the fill material 405 has a coefficient of thermal expansion that is within about 10 percent, and more preferably within about 1 percent, of a coefficient of thermal expansion of the substrate 205.

In some cases, the step 115 of filling the TSV opening 305 with the fill material 405 includes filling the opening 305 with one or more insulating materials, e.g., that includes a passivation layer 410, and a diffusion barrier layer 415. One or both of these layers 410, 415 can coat the interior walls (e.g., sidewalls 420 and floor 425) of the TSV opening 305.

As further illustrated in FIG. 4, in some cases the filling step 115 can include filling the opening 305 with an insulating material 405 that includes an insulating plug 430. In some cases the insulating plug 430 includes or is a dielectric material such as silica glass, and more preferably in some cases, borophosphosilicate glass.

In some cases, the step 115 of filling the TSV opening 305 with the fill material 405 includes filling material 405 that includes multiple layers of insulating material: a passivation layer 410 of silicon oxide that coats the interior walls 420 and floor 425 the opening 305; a diffusion barrier layer 415 of silicon nitride on the passivation layer 410 (e.g., coating the passivation layer 410) and an insulating plug 430 of a dielectric material (e.g., silica glass) contacting the diffusion barrier layer 415 and substantially filling the entire depth or remaining entire depth 435 (e.g., the volume of the opening 305 not occupied by other insulating layers 410, 415 when present) of the front-side through-substrate via opening 305.

Figure 5:
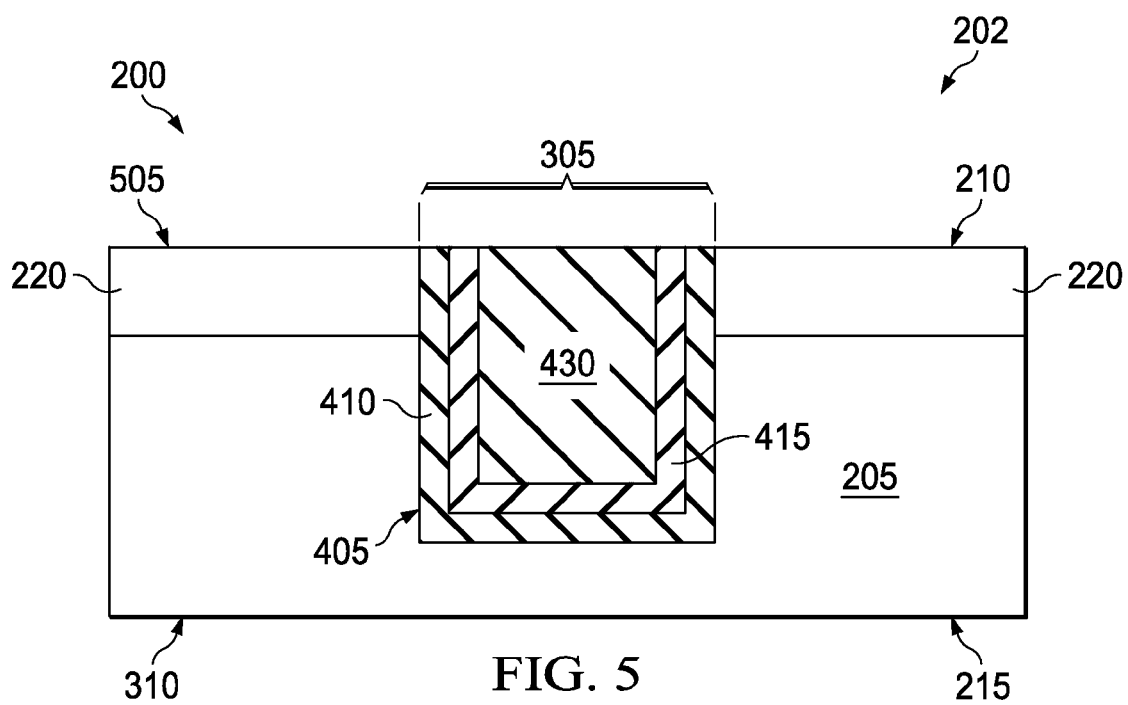

As shown in FIGS. 1 and 5, some embodiments of the methods 100, 102 further include a step 135 of removing the fill material 405 from an exterior surface 505 of the front-side 210 of the substrate 205 that lay outside of the front-side opening 305. One of ordinary skill in the art would be familiar techniques such as chemical mechanical polishing (CMP) to perform step 135 so as to polish and planarize the front-side exterior surface 505 down to the level of the substrate 205 (or its constituent layer 220).

Figure 6:
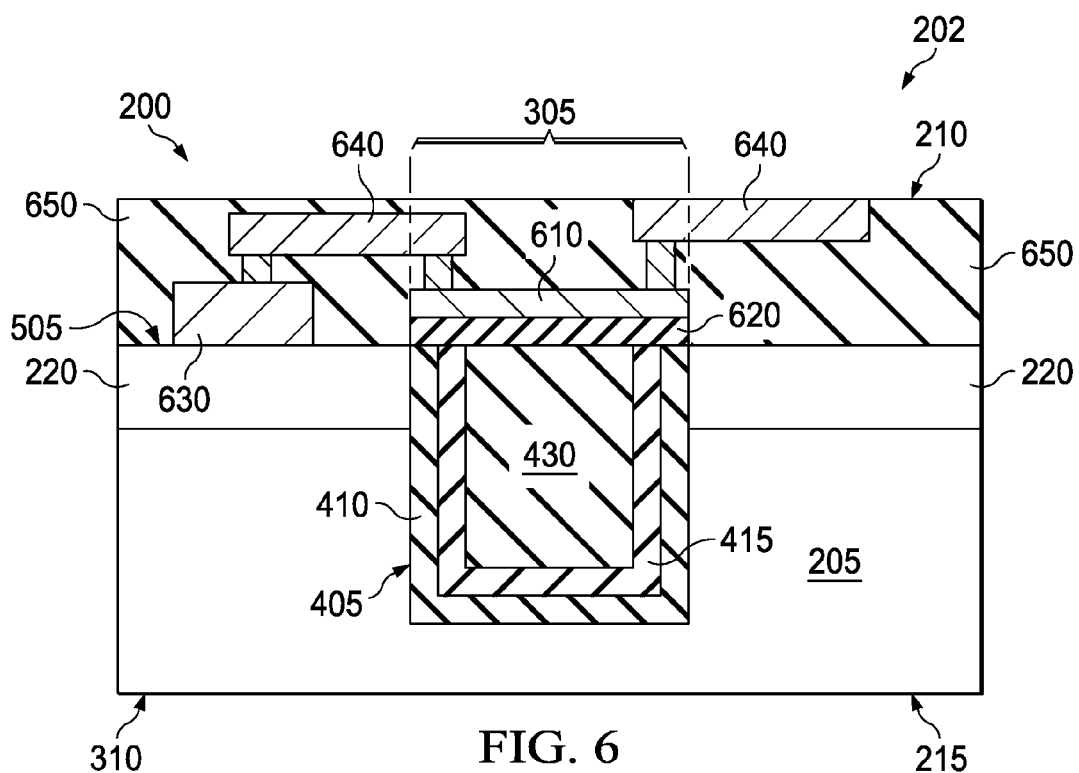

As shown in FIGS. 1 and 6, some embodiments of the methods 100, 102 also include a step 140 of covering the front-side through-substrate via opening 305 with an electrically conductive layer 610. Forming the electrically conductive layer 610 helps to mark the location of the TSV structure 200 and thereby helps ensure that the TSV structure 200 will be aligned with the subsequently formed metal interconnects on the front-side of the substrate. In some embodiments, the back-side through-substrate via opening formed in step 125 is done after step 140 to cover the front-side through-substrate via opening with the electrically conductive layer 610. This order of steps has the advantage of avoiding the back-side opening from being filled with materials associated with the forming the front-side electrically conductive layer covering 610.

In some embodiments, as part of step 140, a second insulating layer 620 (including, e.g., a barrier layer such as a silicon nitride layer) is formed on the front-side surface 505 (e.g., via conventional PVD or CVD processes). Then the electrically conductive layer 610 of a metal (e.g., a copper layer or other metal such as tungsten or gold) is formed on the second insulating layer 620, (e.g., in some cases by sputter depositing a metal seed layer such tungsten, gold or copper) and then electro-chemically forming another metal layer on the seed layer. The electrically conductive layer 610 and second insulating layer 620 can then be patterned using conventional processes to remove these layers 610, 620 from the surface 505 except for those portions that cover the opening 305.

As also shown in FIGS. 1 and 6, some embodiments of the method 102 of manufacturing the IC 202 also includes a step 145 of forming active or passive electrical components 630 on the front-side 210 of the substrate 205. One of ordinary skill in the art would be familiar with the procedures to fabricate passive components 630, such as resistors or inductors, or active components, such as memory circuit components (e.g., SRAM or DRAM memory) or logic circuit components (e.g., CMOS or bi-CMOS logic integrated circuits). In some embodiments, the back-side through-substrate via opening formed in step 125 is done after step 145 of forming the active or passive electrical components 630. This order of steps has the advantage of avoiding the back-side opening from being filled with materials associated with the forming the components 630.

As further shown in FIGS. 1 and 6, some embodiments of the method 102 of manufacturing the IC 202 further include a step 150 of forming interconnect structures 640 (e.g., copper or other metal lines, vias, and landing pads) on the front-side 210 of the substrate 205. One of ordinary skill in the art would be familiar with the procedures to form the interconnect structures 640. For instance, as part of step 150, one or more interlayer dielectric layers 650 can be formed on the front-side 210 to support and electrically insulate the interconnect structures 640 and the passive or active components 630.

In some embodiments, at least one of the interconnect structures 640 contacts (directly or indirectly through additional interconnect structures 640) the electrically conductive layer 610 covering a front-side TSV opening 305, and, also contacts an active or passive component 630 on the substrate 205. That is, the interconnect structure 640 electrically interconnects the active or passive component 630 to the TSV through the electrically conductive layer 610. In other embodiments, however, the TSV or its electrically conductive cover layer 610 may not be coupled to any active or passive component 630 or interconnect structure 640 on the substrate 205, and instead, may simply pass through the substrate 205.

In some embodiments, it is preferable to form the active or passive components 630 in step 145 before filling the TSV opening 305 with an electrically conductive material (step 130) that has a higher thermal expansion coefficient than the substrate (e.g., a metal such as copper). Similarly, in some cases, it is preferable to form the interconnect structures 630 in step 150 before step 130. For instance, this ordering of steps can help avoid thermal expansion stresses and strains on the substrate 205 during high-temperature fabrication processes that may be used as part of steps 145 or 150.

Figure 7:
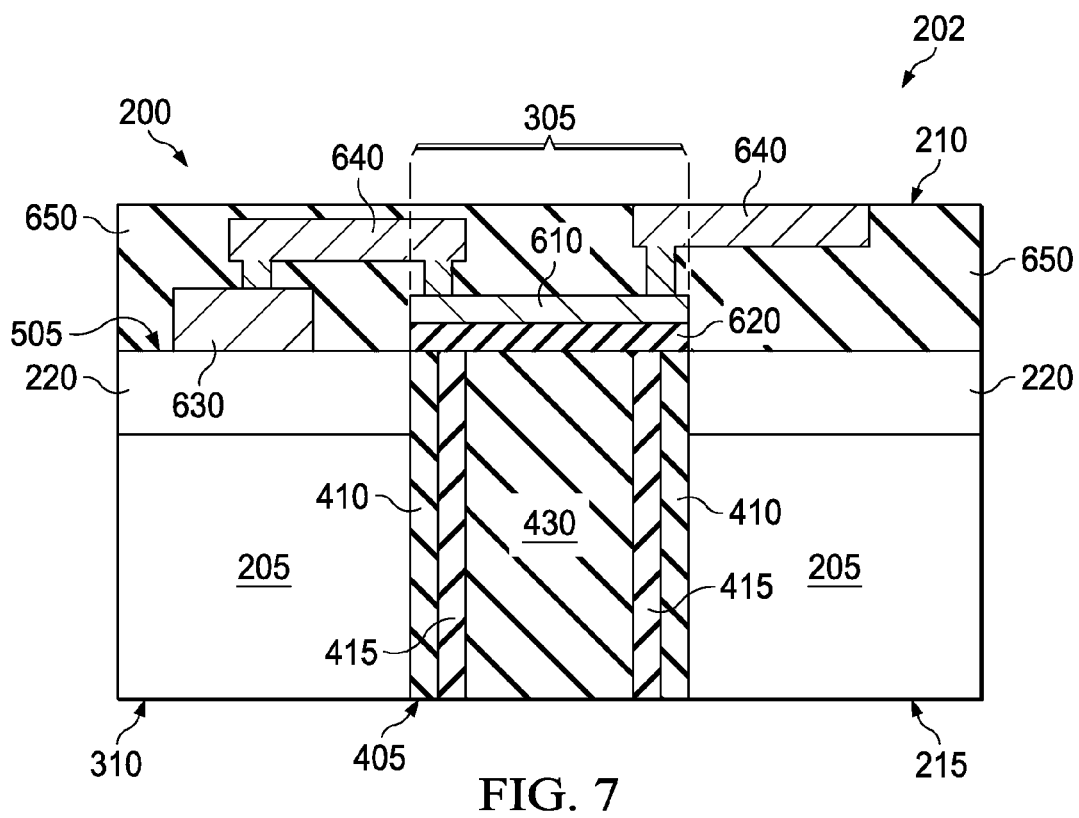

FIG. 7 shows the TSV structure 200 and IC 202 after the step 120 of removing portions of the substrate 205 from the outer surface 310 of the back-side 215 of the substrate 205 to thereby expose the fill material 405. One of ordinary skill in the art would be familiar with procedures to achieve step 120. In some cases, for instance, CMP can be used to polish and planarize the back-side surface 310 until the fill material 405 in the TSV opening 305 is exposed. One skilled in the art would appreciate, however, that other types of removal procedures (e.g., wet and dry etching) could also be used to perform step 120.

Figure 8:
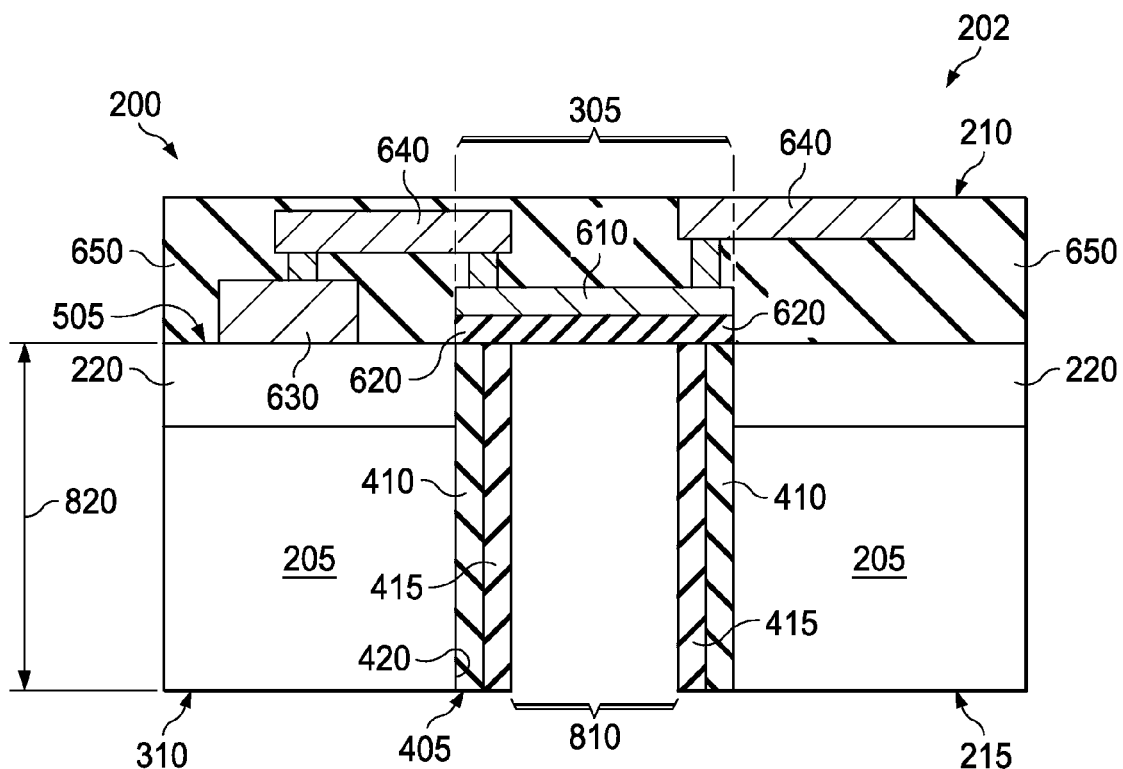

FIG. 8 shows the TSV structure 200 and IC 202 after the step 125 of removing at least portions of the exposed fill material 405 to form a back-side through-substrate via opening 810. In the illustrative embodiment, the back-side through-substrate via opening 810 traverses an entire thickness 820 of the substrate 205.

In some cases, it is desirable to retain some of the insulating material 405 inside of the back-side through-substrate via opening 810. For instance, retaining a passivation layer 410 and barrier layer 415 on the sidewalls 420 of the TSV opening 305 can be advantageous when the back-side through-substrate via opening 810 is to be filled in step 130 with an electrically conductive material composed of highly diffusible metal atoms (e.g., copper atoms). Diffusible metal atoms can detrimentally diffuse from the TSV 200 into the substrate 205, including those regions of the substrate 205 where the active and passive components 630 are located, thereby damaging such components 630.

In some cases, for example, the removing step 125 can include a wet etch process (e.g., a hydrofluoric acid etch process). One skilled in the art would be familiar with how to configure the wet etch process so as to leave the passivation layer 410 and barrier layer 415 substantially intact on the sidewalls 420. For instance, when the plug 430 is composed of a silica glass material such as borophosphosilicate glass, a dry etch process may be used performed to selectively remove the insulating plug 430 that traverses the thickness 820 of substrate 205. In some cases, additionally or alternatively, a hydrofluoric acid wet etch through the back-side through-substrate via opening 810 can be performed to selectively remove the insulating plug 430 traversing the substrate 205, such that after such a wet-etch, the passivation layer 410 of silicon oxide and diffusion barrier layer 415 of silicon nitride are retained.

Figure 9:
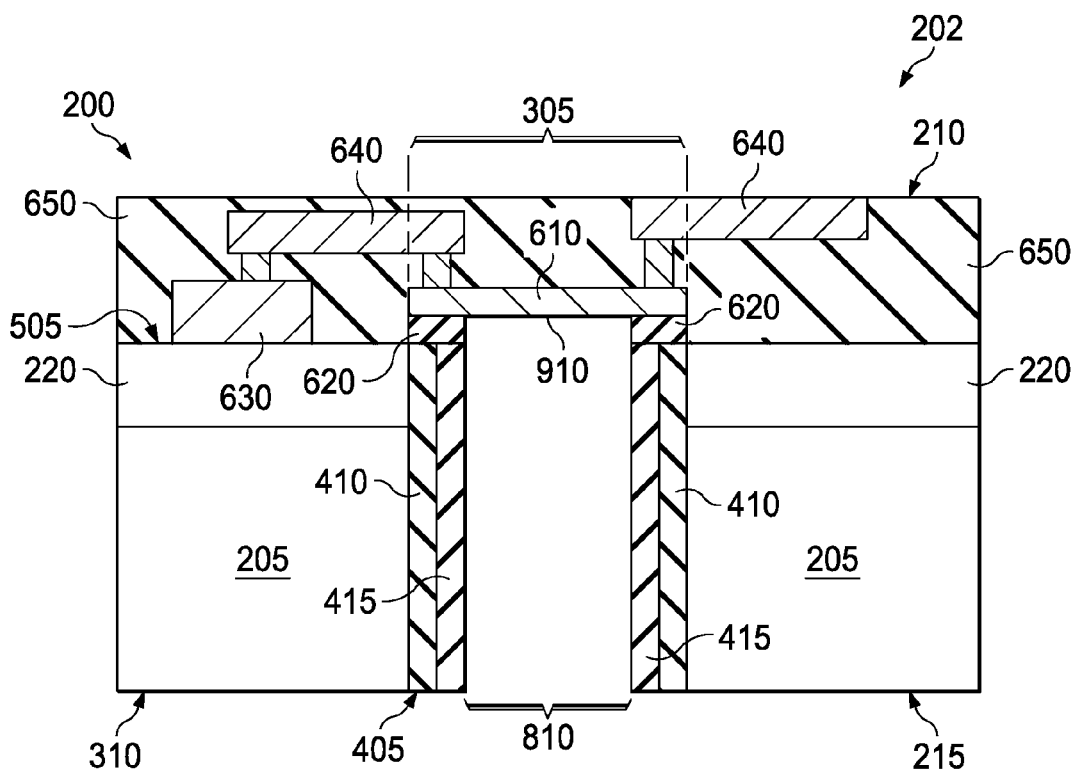

As shown in FIGS. 1 and 9, some embodiments of the methods 100, 102 further include a step 155 of removing an insulating material (e.g., portions of the second insulating layer 620, FIG. 6) located on an electrically conductive layer 610 and that covers the front-side 210 of the through-substrate via opening 305. For instance, the removing step 155 can include a plasma etch process directed through the back-side through-substrate via opening 810 to remove portions of the second insulating layer 620 over the opening 810 so as to expose an interior surface 910 of the electrically conductive material 610 covering the opening 810. The removing step 155 facilitates electrical coupling of the electrically conductive layer 610 to the electrically conductive material that the opening 810 is subsequently filled with in step 130. For instance, in some cases step 115 further includes removing the insulating material 620 on the electrically conductive layer 610 covering the front-side of the through-substrate via opening 810 by a plasma etch process directed through the back-side through-substrate via opening 810. One skilled in the art would be familiar with how to configure the plasma etch processes so as to leave the passivation layer 410 and barrier layer 415 substantially intact on the sidewalls 420, if desired.

Figure 10:
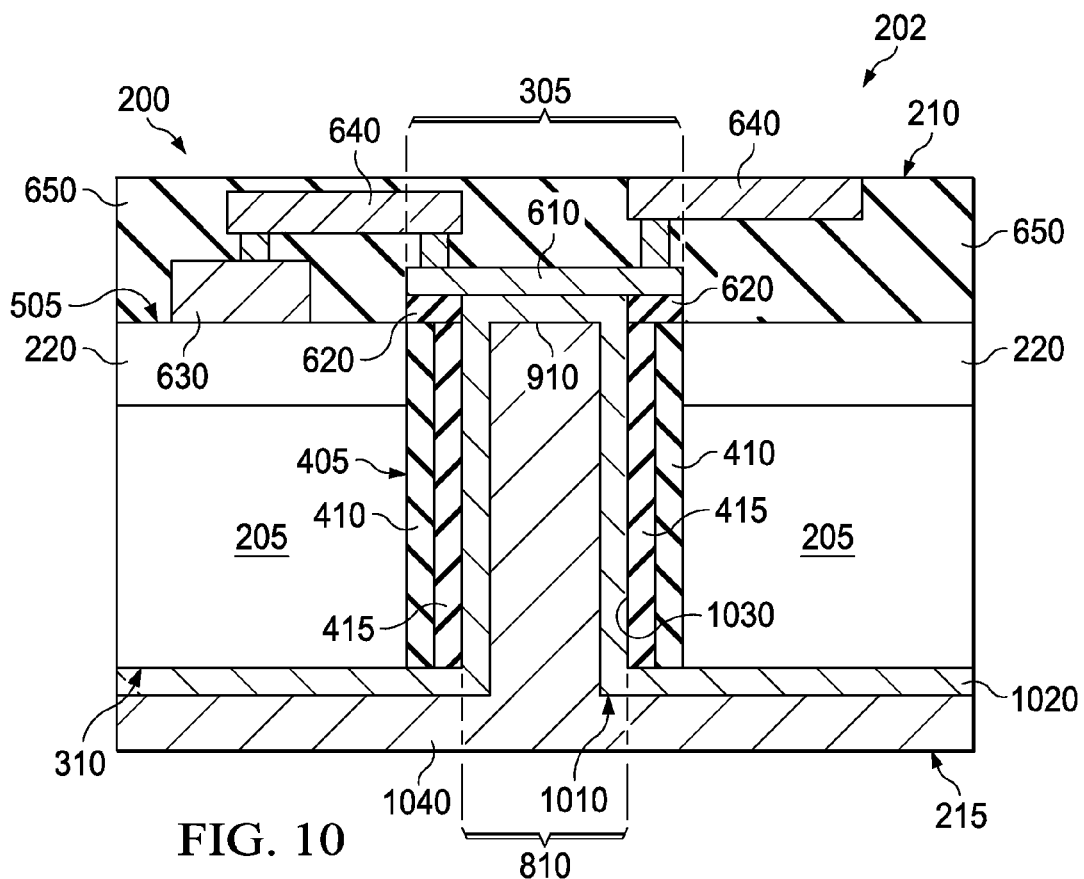

FIG. 10 shows the TSV structure 200 and IC 202 after the step 130 of filling the back-side through-substrate via opening 810 with an electrically conductive material 1010.

Non-limiting examples of the types of electrically conductive material 1010 that could be used includes copper, tungsten, gold, polysilicon, or similar materials familiar to those skilled in the art. In some embodiments, to fill a deep back-side opening 810 (e.g., where the substrate thickness 820, FIG. 8, is about 50 microns or greater) it can be advantageous for the filling step 130 to include forming (e.g., sputter depositing) a metal seed layer 1020 (e.g., a copper seed layer) on the interior side walls 1030 and floor (e.g., the interior surface 910) of the back-side opening 810. In some cases, the interior sidewalls 1030 can include one or more intervening insulating layers 410, 415 that were front-side formed in step 115. In some cases, the filling step 130 can further include electrochemically forming a bulk metal 1040 (e.g., on the metal seed layer 1020 to fill the back-side through-substrate via opening 810. In some preferred embodiments, the electrically conductive material 1010 forms a solid (i.e., a void-free) conductive plug that entirely fills the opening 810.

Figure 11:
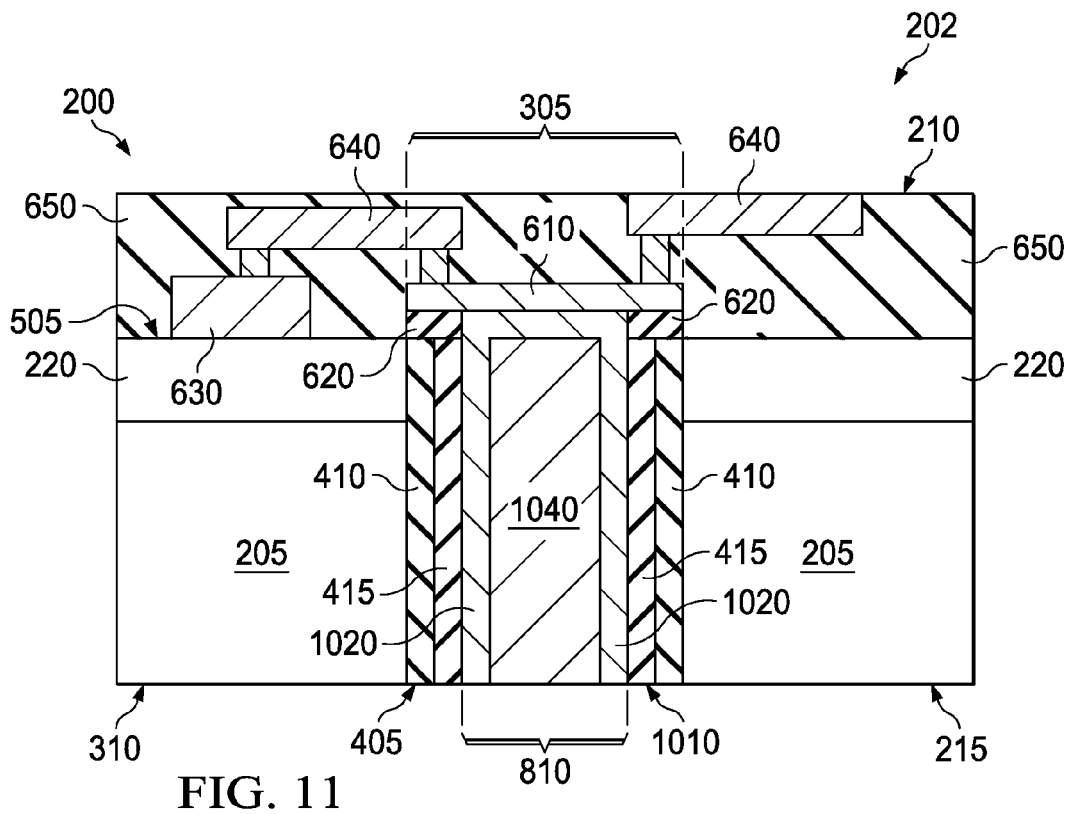

As shown in FIGS. 1 and 11, some embodiments of the methods 100, 102 further include a step 160 of removing the electrically conductive material 1010 from the back-side surface 310 of the substrate 205 that lies outside of the back-side through-substrate via opening 810. One of ordinary skill in the art would be familiar with techniques such as CMP to perform step 160 so as to polish and planarize the back-side surface 310 down to the level of the substrate 205, such that the substrate outer surface 310 on the back-side 215 is exposed.

Figure 12:
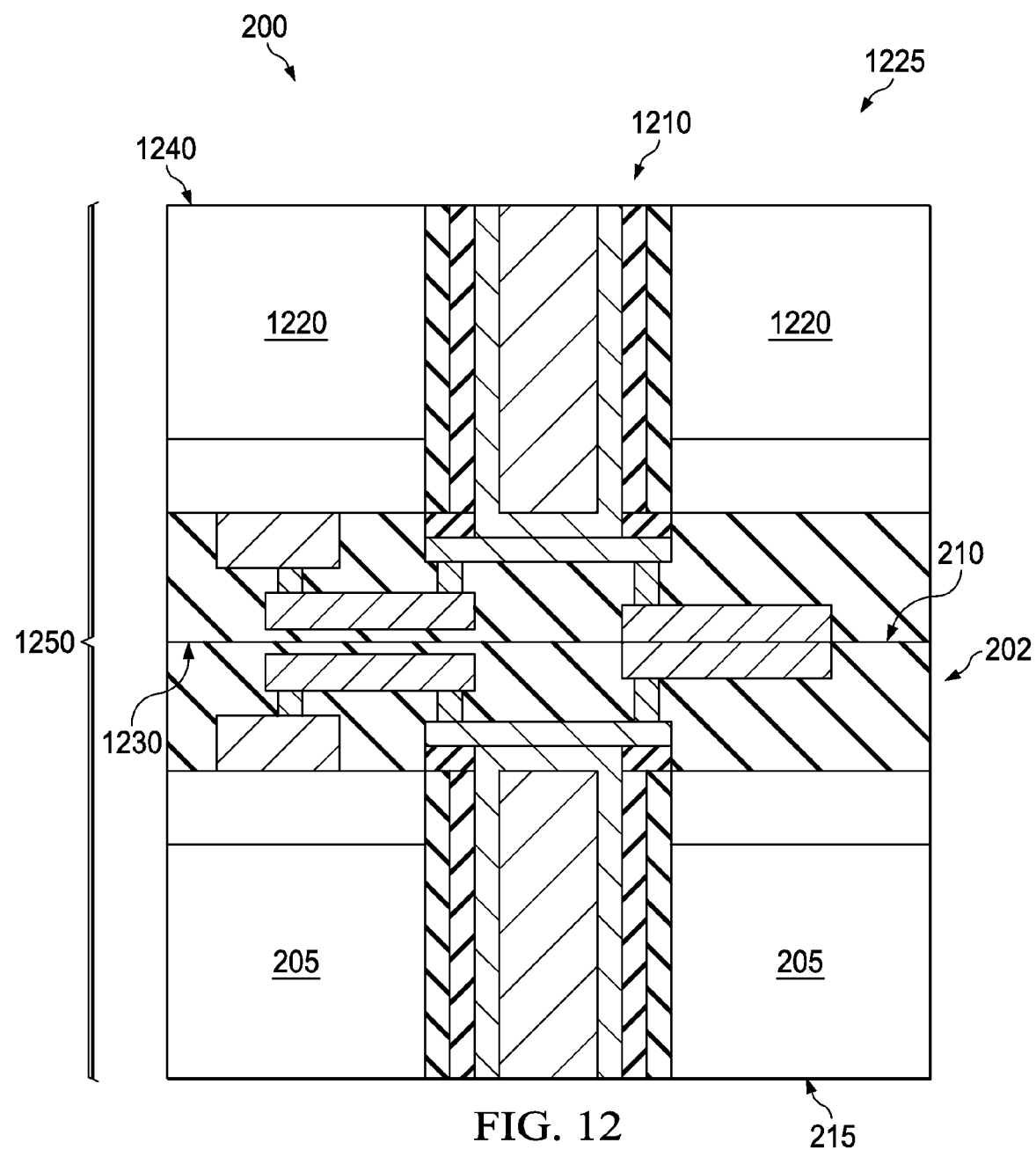

As shown in FIGS. 1 and 12, some embodiments of the method 102 of manufacturing the IC 202 further include a step 165 of interconnecting the TSV structure 200 of the substrate 205 to another TSV structure 1210 of another substrate 1220 that is vertically stacked with the substrate 205. One of ordinary skill in the art would be familiar with procedures, such as flip chip bonding processes, to facilitate stacking of the substrates 205, 1220 such that the TSVs 200, 1210 are interconnected. The substrates 200, 1210 and IC 202 can be part of an IC package 1225.

As illustrated in FIG. 12, in some embodiments, the front-side 210 of the substrate 205 faces the front-side 1230 of the other substrate 1220. In other embodiments, however, the back-side 210 of the substrate 205 can face the back-side 1240 of the other substrate 1220. In still other embodiments, there could be a stack 1250 of multiple substrates 205, 1220 that are similarly interconnected to their adjacent substrate, or, to non-adjacent substrates by TSVs 200, 1210. For instance, a first substrate could be interconnected to a third substrate through the TSV passing through a second substrate that is located in between the first and third substrate.

Additionally, as further explained in Bachman et al., embodiments of the IC 202 could further include shallow trench isolation structures located between the passive or active components 630 or between TSV structures 200 and the passive or active components 630.

FIGS. 1-12 illustrate still another embodiment of the disclosure, a through-substrate-via structure 200. Embodiments of the through-substrate-via structure 200 can be manufactured by a method 100 that includes steps 110-130 as discussed in the context of FIG. 1. Embodiments of the method 100 of forming the through-substrate-via structure 200 can include embodiments of steps 110-130 as further discussed in the context of FIGS. 1-12 and could include any of the features discussed above in the context of FIGS. 1-12.

FIGS. 1-12 illustrate yet another embodiment of the disclosure, an integrated circuit. With continuing reference to FIGS. 1-12. The example IC 202 comprises a substrate 205 and a through-substrate-via structure 200 that traverses the substrate 205. The through-substrate-via structure 200 is formed by a method 100 that includes steps 110-130 shown in FIG. 1. Embodiments of the IC 205 can include any of the features discussed above in the context of FIGS. 1-12.

Those skilled in the art to which this application relates will appreciate that other and further additions, deletions, substitutions and modifications may be made to the described embodiments.

The invention claimed is:

1. A method of manufacturing a through-substrate-via structure, comprising:
    providing a substrate having a front-side and an opposite back-side;
    forming a through-substrate via opening in the front-side of the substrate, wherein the through-substrate-via opening does not penetrate an outer surface of the back-side of the substrate;
    filling the through-substrate-via opening with a solid fill material;
    removing portions of the substrate from the outer surface of the back-side of the substrate to thereby expose the fill material;
    removing at least portions of the exposed fill material to form a back-side through-substrate via opening that traverses an entire thickness of the substrate; and
    filling the back-side through-substrate via opening with an electrically conductive material.

2. The method of claim 1, wherein the fill material has a coefficient of thermal expansion that is within about 10 percent of a coefficient of thermal expansion of the substrate.

3. The method of claim 1, wherein the fill material has a coefficient of thermal expansion that is within about 1 percent of a coefficient of thermal expansion of the substrate.

4. The method of claim 1, wherein the fill material includes one or more insulating material.

5. The method of claim 4, insulating material includes a passivation layer that coats the interior walls of the back-side through-substrate via opening.

6. The method of claim 4, wherein the insulating material includes a diffusion barrier layer that coats the interior walls of the through-substrate via opening.

7. The method of claim 4, wherein the insulating material includes an dielectric material plug.

8. The method of claim 4, wherein the insulating material includes passivation layer of silicon oxide that coats the interior walls of the back-side through-substrate via opening, a diffusion barrier layer of silicon nitride that coats the passivation layer, and an insulating plug of borophosphosilicate glass contacting the diffusion barrier layer and substantially traversing an entire remaining depth of the front-side through-substrate via opening.

9. The method of claim 1, further including covering the front-side through-substrate via opening with an electrically conductive layer, wherein the back-side through-substrate via opening is formed after covering the front-side through-substrate via opening with the electrically conductive layer.

10. The method of claim 1, wherein removing portions of the substrate from the outer surface of the back-side includes chemical-mechanical polishing the back-side.

11. The method of claim 1, wherein removing at least portions of the exposed fill material to form the back-side through-substrate via opening includes a wet etch process.

12. The method of claim 1, further including removing an insulating material on an electrically conductive layer covering the front-side of the through-substrate via opening by a plasma etch process directed through the back-side through-substrate via opening.

13. The method of claim 1, wherein filling the back-side through-substrate via opening include forming a seed metal layer on the interior walls of the back-side through-substrate via opening, and electrochemically forming a bulk metal to fill the back-side through-substrate via opening.

14. A method of manufacturing an integrated circuit, comprising:
    providing a substrate having a front-side and an opposite back-side; and
    forming a through-substrate-via structure, including:
        forming a through-substrate via opening in the front-side of the substrate, wherein the through-substrate-via opening does not penetrate an outer surface of the back-side of the substrate;
        filling the through-substrate-via opening with a fill material;
        removing portions of the substrate from the outer surface of the back-side of the substrate to expose the fill material;
        removing at least portions of the exposed fill material to form a back-side through-substrate via opening that traverses an entire thickness of the substrate; and filling the back-side through-substrate via opening with an electrically conductive material.

15. The method of claim 14, further including covering the front-side through-substrate via opening with an electrically conductive layer, wherein the back-side through-substrate via opening is formed after covering the front-side through-substrate via opening with the electrically conductive layer.

16. The method of claim 14, further including forming active or passive electrical components on the front-side of the substrate, wherein the back-side through-substrate via opening is filled with the electrically conductive material after forming the active or passive electrical components.

17. The method of claim 14, further including forming an interconnect structure on the front-side of the substrate, wherein the back-side through-substrate via opening is formed after forming the interconnect structures.

18. The method of claim 14, further including interconnecting the through-substrate via structures to another through-substrate via structure of another substrate that is vertically stacked with the substrate.

* * * * *